(12) United States Patent
Gossman et al.

(10) Patent No.: US 11,114,379 B2
(45) Date of Patent: Sep. 7, 2021

(54) INTEGRATED CIRCUITRY, MEMORY INTEGRATED CIRCUITRY, AND METHODS USED IN FORMING INTEGRATED CIRCUITRY

(71) Applicant: Micron Technology, Inc., Boise, ID (US)

(72) Inventors: Michael J. Gossman, Meridian, ID (US); M. Jared Barclay, Middleton, ID (US); Matthew J. King, Boise, ID (US); Eldon Nelson, Dripping Springs, TX (US); Matthew Park, Boise, ID (US); Jason Reece, Boise, ID (US); Lifang Xu, Boise, ID (US); Bo Zhao, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 116 days.

(21) Appl. No.: 15/995,475

(22) Filed: Jun. 1, 2018

(65) Prior Publication Data

US 2019/0371728 A1 Dec. 5, 2019

(51) Int. Cl.
| | |
|---|---|
| *H01L 23/528* | (2006.01) |
| *H01L 27/11556* | (2017.01) |
| *H01L 27/11582* | (2017.01) |
| *H01L 27/11524* | (2017.01) |
| *H01L 27/1157* | (2017.01) |
| *H01L 27/11548* | (2017.01) |
| *H01L 23/522* | (2006.01) |
| *H01L 21/768* | (2006.01) |
| *H01L 27/11575* | (2017.01) |

(Continued)

(52) U.S. Cl.
CPC .... *H01L 23/5283* (2013.01); *H01L 21/76816* (2013.01); *H01L 23/5226* (2013.01); *H01L 27/1157* (2013.01); *H01L 27/11524* (2013.01); *H01L 27/11548* (2013.01); *H01L 27/11556* (2013.01); *H01L 27/11575* (2013.01); *H01L 27/11582* (2013.01); *H01L 27/11529* (2013.01); *H01L 27/11573* (2013.01)

(58) Field of Classification Search
None
See application file for complete search history.

(56) References Cited

U.S. PATENT DOCUMENTS

| | | | |
|---|---|---|---|
| 9,589,978 B1 | 3/2017 | Yip | |
| 10,340,281 B2 * | 7/2019 | Jiang | H01L 27/11582 |

(Continued)

*Primary Examiner* — Andres Munoz
(74) *Attorney, Agent, or Firm* — Wells St. John P.S.

(57) ABSTRACT

A method used in forming integrated circuitry comprises forming a stack of vertically-alternating tiers of different composition materials. A stair-step structure is formed into the stack and an upper landing is formed adjacent and above the stair-step structure. The stair-step structure is formed to comprise vertically-alternating tiers of the different composition materials. A plurality of stairs individually comprise two of the tiers of different composition materials. At least some of the stairs individually have only two tiers that are each only of a different one of the different composition materials. An upper of the stairs that is below the upper landing comprises at least four of the tiers of different composition materials. Structure independent of method is disclosed.

40 Claims, 13 Drawing Sheets

(51) Int. Cl.
*H01L 27/11573* (2017.01)
*H01L 27/11529* (2017.01)

(56) References Cited

U.S. PATENT DOCUMENTS

| | | | |
|---|---|---|---|
| 2010/0224962 A1* | 9/2010 | Kim | H01L 23/5228 |
| | | | 257/536 |
| 2014/0162420 A1* | 6/2014 | Oh | H01L 27/11565 |
| | | | 438/270 |
| 2015/0001613 A1 | 1/2015 | Yip et al. | |
| 2017/0263556 A1 | 9/2017 | Tessariol et al. | |
| 2017/0287833 A1 | 10/2017 | Thimmegowda et al. | |
| 2018/0082940 A1 | 3/2018 | Sorensen et al. | |
| 2018/0308748 A1* | 10/2018 | Chen | H01L 27/11565 |
| 2019/0081061 A1* | 3/2019 | Tessariol | H01L 27/11582 |

* cited by examiner

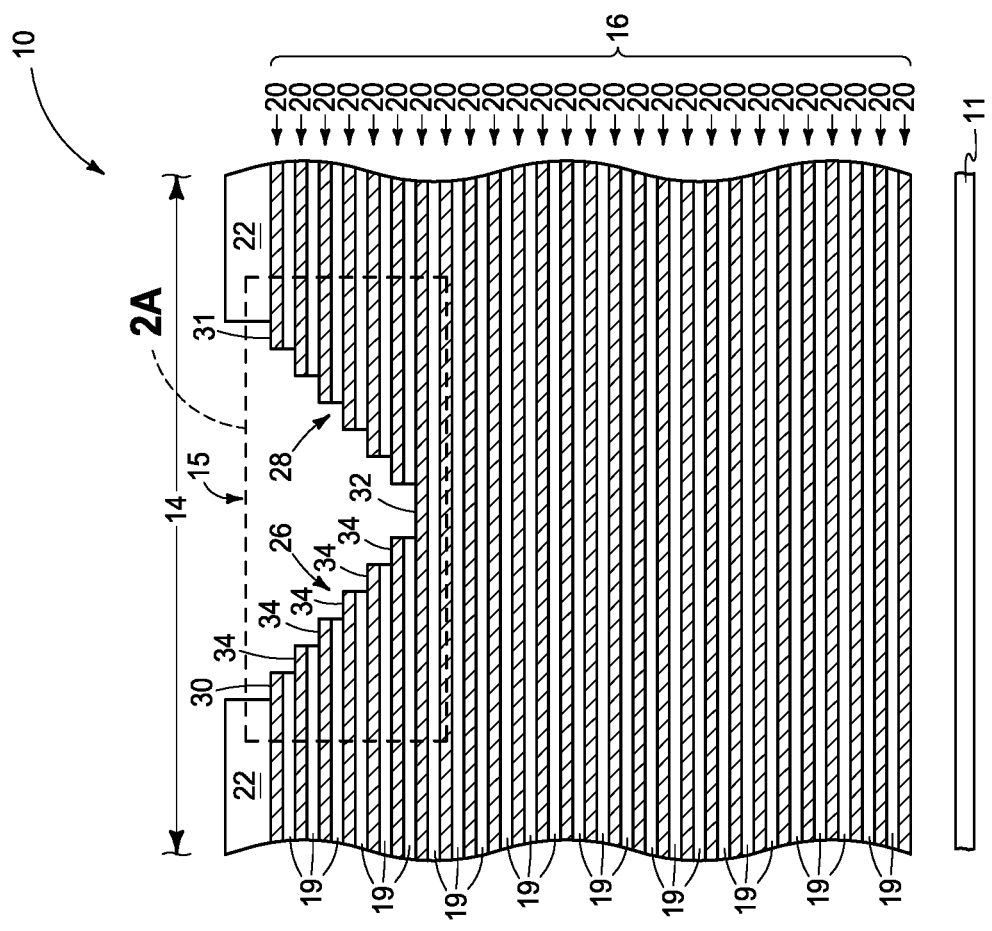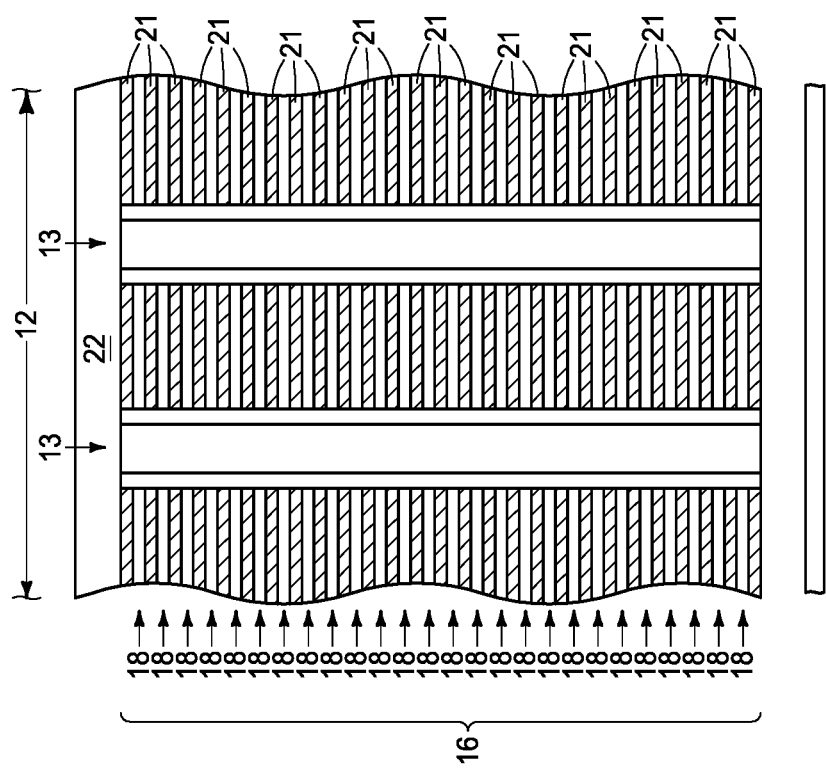
FIG. 2

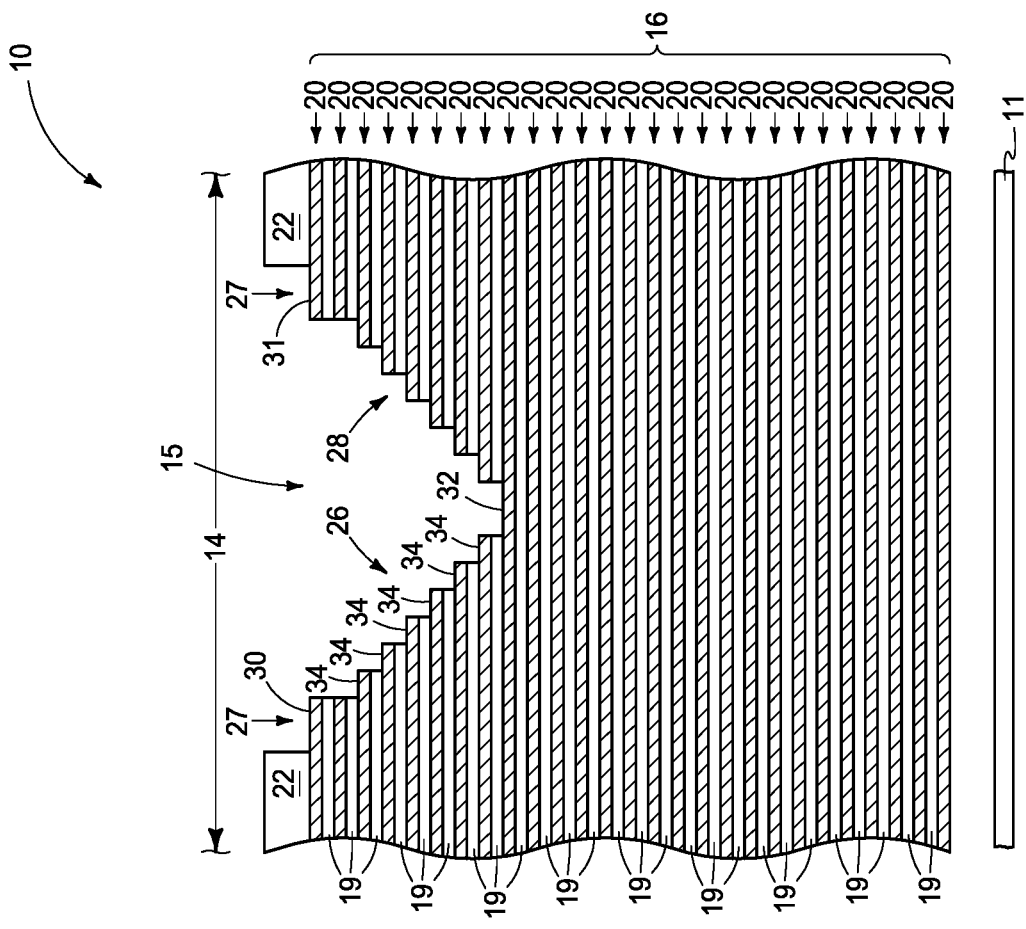
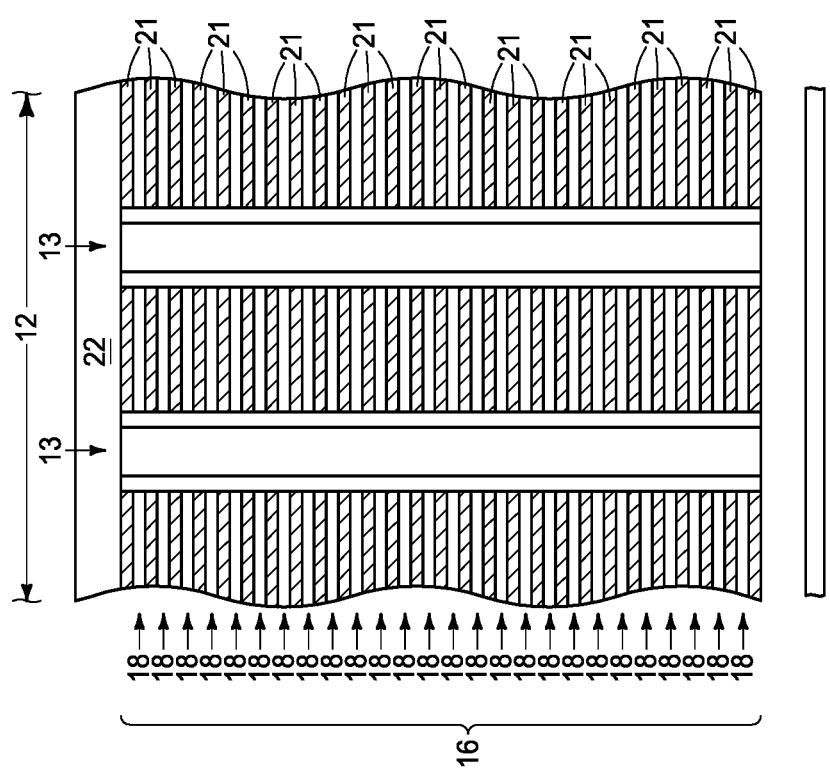
FIG. 4

INTEGRATED CIRCUITRY, MEMORY INTEGRATED CIRCUITRY, AND METHODS USED IN FORMING INTEGRATED CIRCUITRY

TECHNICAL FIELD

Embodiments disclosed herein pertain to integrated circuitry, to memory integrated circuitry, and to methods used in forming integrated circuitry.

BACKGROUND

Memory is one type of integrated circuitry and is used in computer systems for storing data. Memory may be fabricated in one or more arrays of individual memory cells. Memory cells may be written to, or read from, using digit lines (which may also be referred to as bit lines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells.

One proposed way of increasing integrated circuitry density is to form a three-dimensional (3D) array comprising tiers of electronic components, for example tiers of non-programmable transistors and/or programmable transistors that may be part of memory circuitry. The gates of such transistors may be patterned into gate lines (and which may be plate-like) in the individual tiers. Connections to these gate lines may occur in a so-called "stair-step structure" at an end or edge of the tiers of transistors or other electronic components. The stair-step structure includes individual "stairs" (alternately termed "steps" or "stair-steps") that define contact regions of the individual gate lines upon which elevationally-extending conductive vias contact to provide electrical access to the gate lines or other conductive structures.

BRIEF DESCRIPTION OF THE DRAWINGS

FIG. 2 is a view of the FIG. 1 construction at a processing step subsequent to that shown by FIG. 1.

FIG. 4 is a view of the FIG. 3 construction at a processing step subsequent to that shown by FIG. 3.

DETAILED DESCRIPTION OF EXAMPLE EMBODIMENTS

Embodiments of the invention encompass methods use in forming integrated circuitry, for example a three-dimensional (3D) array comprising tiers of electronic components. In some embodiments, those electronic components comprise transistors, and in some embodiments those electronic components comprise memory cells (e.g., that may individually include a transistor). In some embodiments, the integrated circuitry that is formed is memory integrated circuitry that comprises an array of elevationally-extending strings of memory cells that individually comprise a programmable charge-storage transistor, for example an array of NAND or other memory cells having its peripheral circuitry under the array (e.g., CMOS under-array). Embodiments of the invention encompass so-called "gate-last" or "replacement-gate" processing, so-called "gate-first" processing, and other processing whether existing or later-developed independent of when transistor gates are formed. First example embodiments are described with reference to FIGS. 1-8 which may be considered as a "gate-last" or "replacement-gate" process.

Figure 1:
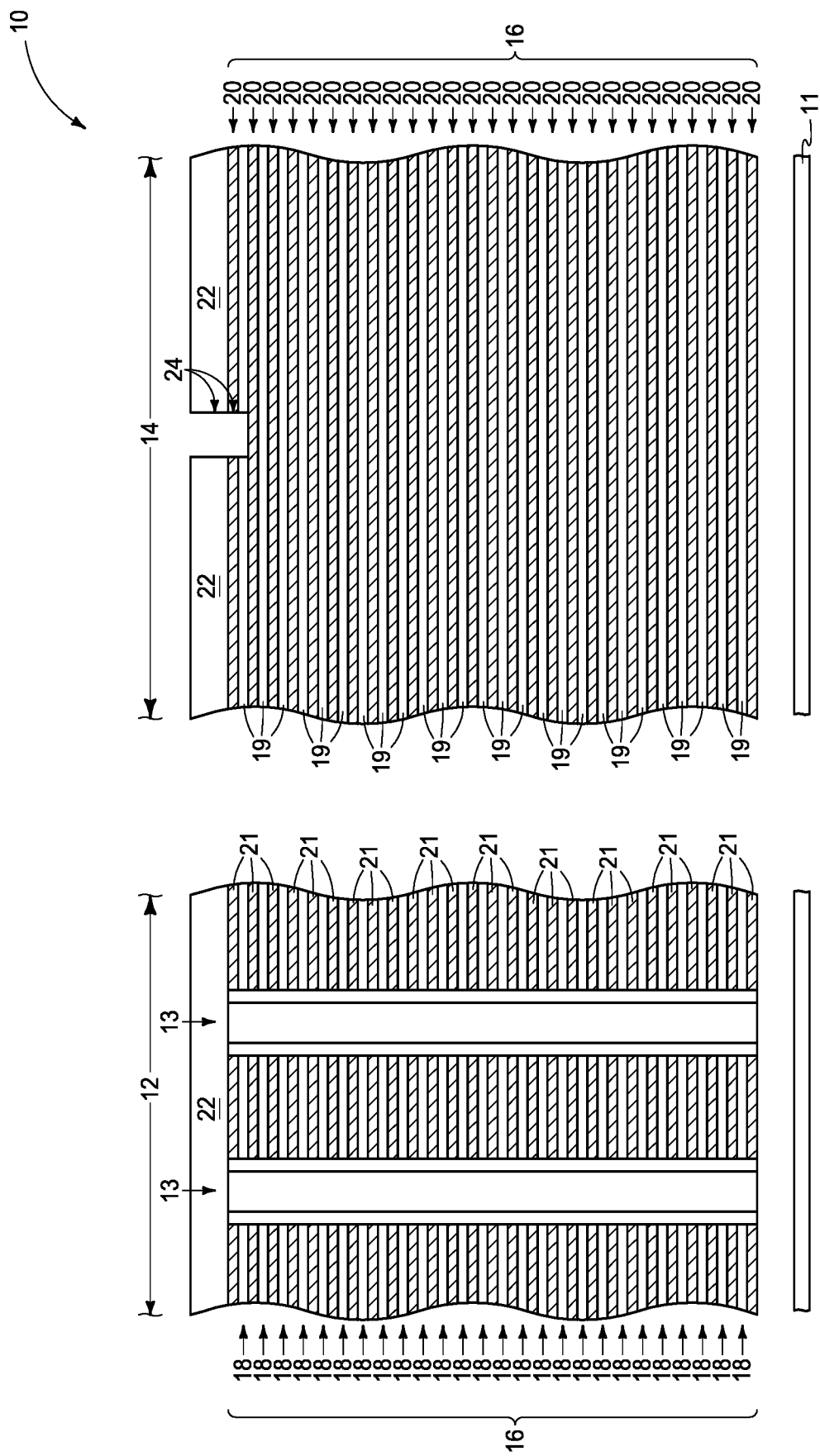
FIG. 1 is a diagrammatic cross-sectional view of a portion of a substrate construction in process in accordance with an embodiment of the invention.

FIG. 1 shows a substrate construction 10 in process of a method of forming an array 12 of what will be elevationally-extending strings 13 of memory cells. The memory cells in one embodiment will individually comprise a programmable charge-storage transistor. An example base substrate 11 of construction 10 may include any one or more of conductive/conductor/conducting (i.e., electrically herein), semiconductive/semiconductor/semiconducting, or insulative/insulator/insulating (i.e., electrically herein) materials. Various materials have been formed above base substrate 11. Materials may be aside, elevationally inward, or elevationally outward of the FIG. 1-depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may be fabricated and operated independently, in tandem, or otherwise relative one another. In this document, a "sub-array" may also be considered as an array. A circuitry region 14 is adjacent array 12. The example-depicted elevationally-extending strings 13 are shown as having been fabricated prior to certain acts described below with respect to the processing of FIGS. 1-8, although such may be formed in the midst of or later than the processing shown by FIGS. 1-8.

A stack 16 of vertically-alternating tiers 18, 20 of different composition first and second materials 19, 21, respectively, has been formed. Tiers 18 or tiers 20 may be sacrificial with the other of tiers 18 or 20 being insulative. Alternately, as an example, tiers 18 or 20 may be conductive and the other of tiers 18 or 20 could be insulative. In the example embodiment, tiers 20 are sacrificial and will ultimately comprise wordline tiers 20 and tiers 18 are insulative. An example sacrificial material 21 is silicon nitride and an example insulative material 19 is silicon dioxide. Such may be formed to be of the same or different thicknesses relative one another, and each need not be of the same respective thickness within the example depicted stack. Construction 10 is shown as having fifty-three vertically-alternating tiers 18 and 20 although fewer or likely many more (e.g., hundreds, etc.) may be formed. Accordingly, more tiers 18, 20 may be below the depicted tiers and above base substrate 11 and/or more tiers 18, 20 may be above the depicted tiers.

A stair-step structure will be formed into stack 16 in circuitry region 14. Such stair-step structure may be formed by any existing or later-developed method(s). As one such example, a masking material 22 (e.g., a photoimageable material such as photoresist) has been formed atop stack 16 and an opening 24 has been formed there-through. Then, masking material 22 has been used as a mask while etching (e.g., anisotropically) through opening 24 to extend such opening 24 into the outermost two tiers 18, 20, for example, as shown.

Figure 2A:
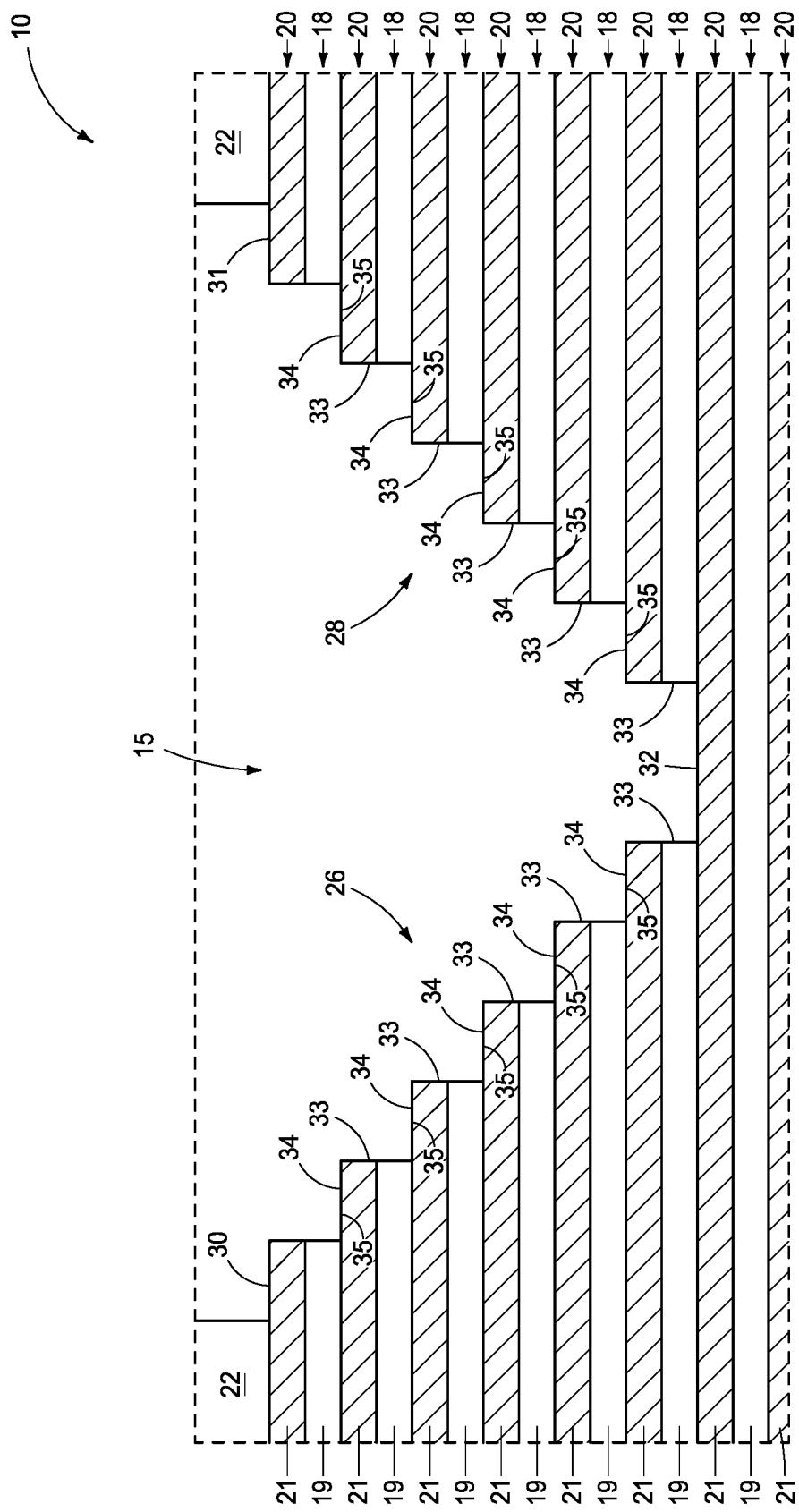
FIG. 2A is an enlarged view of a portion of FIG. 2.

Referring to FIGS. 2 and 2A, substrate construction 10 of FIG. 1 has been subjected to a successive alternating series of lateral-trimming etches of masking material 22 followed by etching deeper into stack 16 two-tiers 18, 20 at a time using the trimmed masking material 22 as a mask. Such has resulted in the forming of a stair-step structure 26 into stack 16 that comprises vertically alternating tiers 18, 20 of different composition materials 19, 21, and in the forming of another stair-step structure 28 opposite and facing stair-step structure 26. Example stair-step structures 26 and 28 are each shown as comprising a plurality of stairs 34 (e.g., as a respective flight of stairs 34) individually comprising two of tiers 18, 20 of different composition materials 19, 21. At least some of stairs 34 (all as shown in FIGS. 2 and 2A) in stair-step structure 26 individually have only two tiers 18 and 20 that are each only one of a different one tier 18 or 20 of the different composition materials 19, 21. Regardless, by way of examples only, only one flight of stairs may be formed, more than two flights may be formed (e.g., aside and/or longitudinally spaced from one another), and if multiple flights of stairs are formed such may not be of the same shape, configuration, and/or number of steps relative one another (not shown). Alternate existing or later-developed methods may be used to form stair-step structure 26 and/or 28.

In one embodiment and as shown, stair-step structures 26 and 28 are mirror-image relative one another. Alternately by of example, only a single stair-step structure 26 or 28 may be formed with an opposing wall being substantially vertical (not shown) in place of the other of the stair-step structures. An upper landing 30 and/or 31 is adjacent and above stair-step structure 26 (regardless of whether covered by masking material 22 at this point in the example process), with upper landing 30 being immediately-adjacent stair-step structure 26. A lower landing 32 is adjacent stair-step structure 26, and in the depicted embodiment is between stair-step structure 26 and stair-step structure 28. Landings 30, 31, and 32 may individually have any lateral width and need not have the same lateral width as any other of landings 30, 31, and 32.

For purposes of the continuing discussion, stairs 34 may be considered as individually comprising a rise 33 and a run 35. All rises need not be the same dimensions relative one another, all runs need not be the same dimensions relative one another, and if the same the rises and runs taken together need not be the same dimensions relative one another. By way of example only, the dimensions of rises 33 and runs 35 are all shown in the depicted cross-section as being equal to one another. Also, stair-step structures 26 and 28 are each shown as having five stairs between the upper and lower landings. More or fewer stairs (likely more) may be in a stair-step structure. Stair-step structures 26 and 28 taken together may define a stadium 15 (e.g., a recessed portion).

Figure 3:
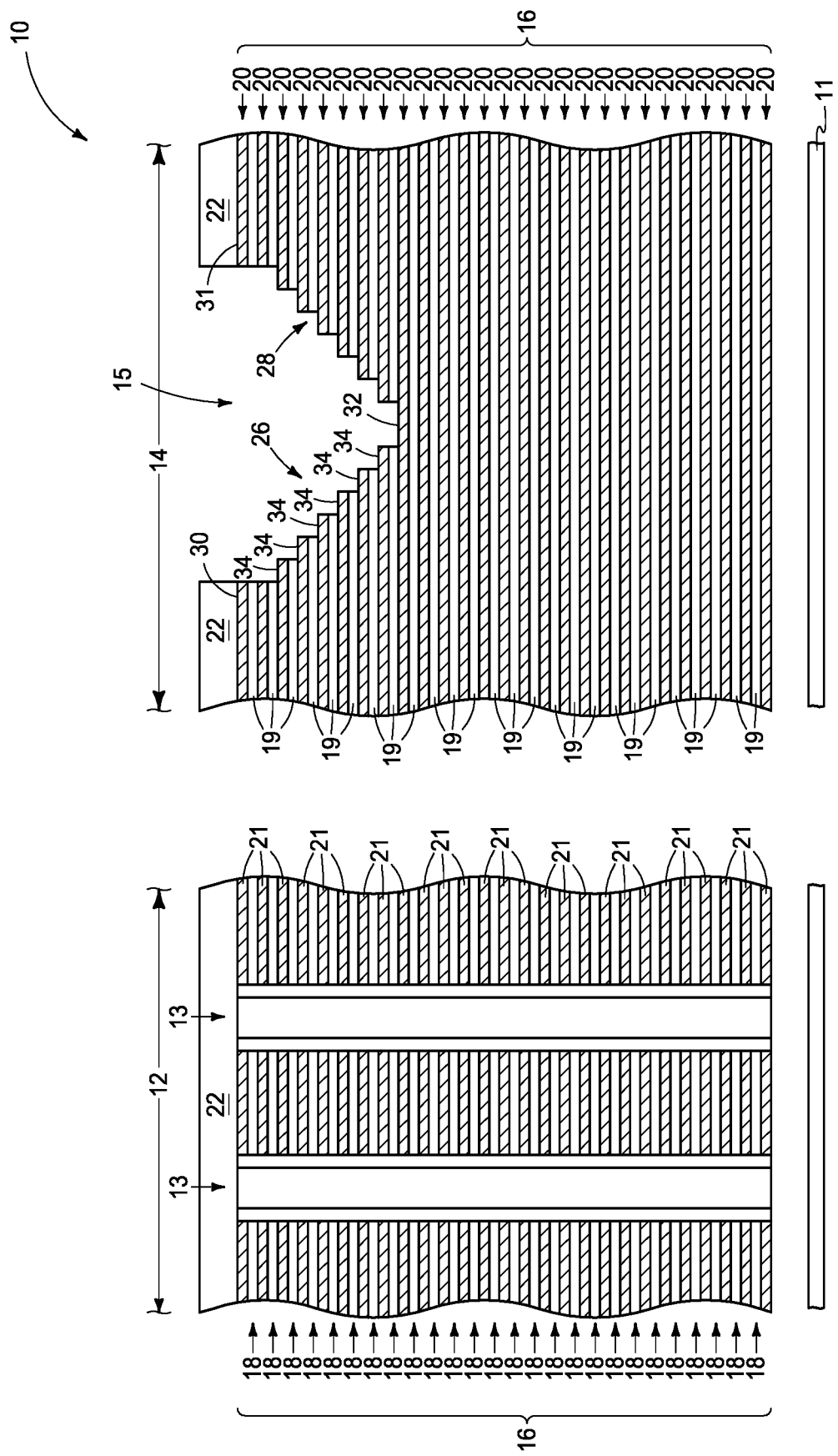
FIG. 3 is a view of the FIG. 2 construction at a processing step subsequent to that shown by FIG. 2.

Referring to FIG. 3, stair-step structures 26 and 28 have been translated at least partially (totally as shown) deeper into stack 16 by etching deeper into stack 16. In the shown example, such has been etched four-tiers 18, 20 deeper into stack 16, although more tiers 18, 20 may be etched into stack 16 from landing 30. Regardless, example stair-step structure 26 (and correspondingly stair-step structure 28) is shown as now having six stairs 34 between upper landing 30 and lower landing 32 the result of masking material 22 having been laterally trimmed back from the depicted vertical edges of top tiers 20 and 18 as shown in FIGS. 2 and 2A. A total of five steps (not shown) would have resulted if masking material 22 had not been so laterally trimmed.

Referring to FIG. 4, masking material 22 has been laterally trimmed as shown. Such has exposed laterally-opposing portions 27 of stack 16 (e.g., more of landings 30 and 31 if exposed by the processing of FIG. 2). In the depicted example, exposed portions 27 are shown as individually being two times as deep as the common dimension of individual runs 35 (runs 35 being shown in FIGS. 2 and 2A, yet not in FIG. 4 for better clarity in FIG. 4). However, lateral dimension(s) of portions 27 may individually be equal to, less than, or more than any run 35 of any stair 34, and laterally-opposing portions 27 need not have the same lateral dimensions relative one another.

Figure 5:
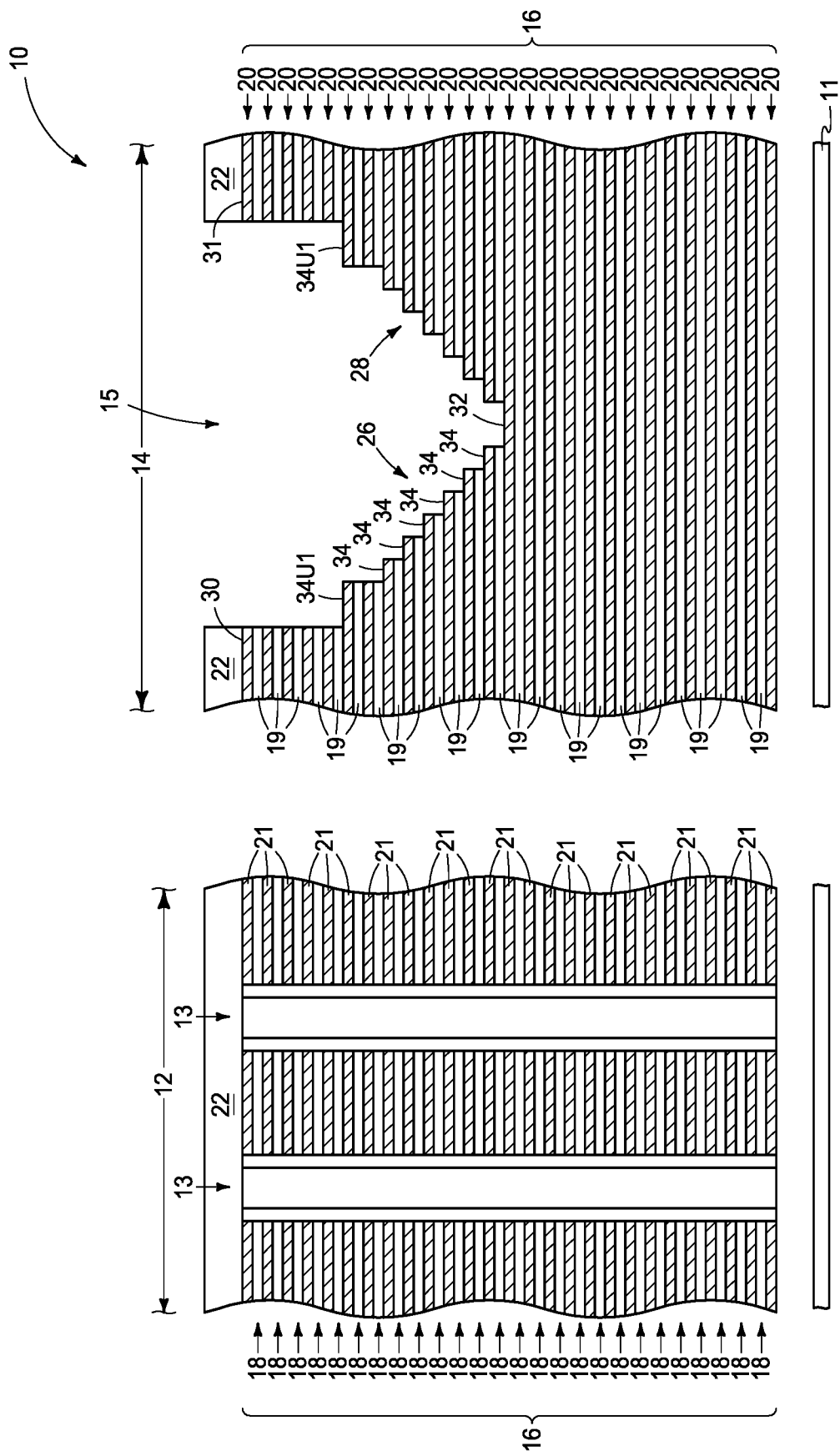
FIG. 5 is a view of the FIG. 4 construction at a processing step subsequent to that shown by FIG. 4.

Referring to FIG. 5, stair-step structures 26, 28 have again been translated at least partially (totally as shown) deeper into stack 16 by etching deeper into stack 16 using masking material 22 of FIG. 4 as a mask. By way of example only, such is shown as having etched ten tiers 18, 20 into stack 16. More or less than ten tiers 18, 20 may alternately be etched. Regardless, deeper stair-step structure 26 (and in one embodiment stair-step structure 28) comprises an upper stair 34U1 that is below upper landing 30 and comprises at least four of tiers 18, 20 of different composition materials 19, 21. Example upper stair 34U1 is shown as having only four tiers 18, 20, although more tiers 18, 20 (e.g., 6, 8, 10, etc., and that may include an odd numbers of tiers, and not shown) may be in upper stair 34U1. In one embodiment and as shown at least at this point in the example process, upper stair 34U1 is the uppermost stair of stair-step structure 26 below landing 30.

Figure 6:
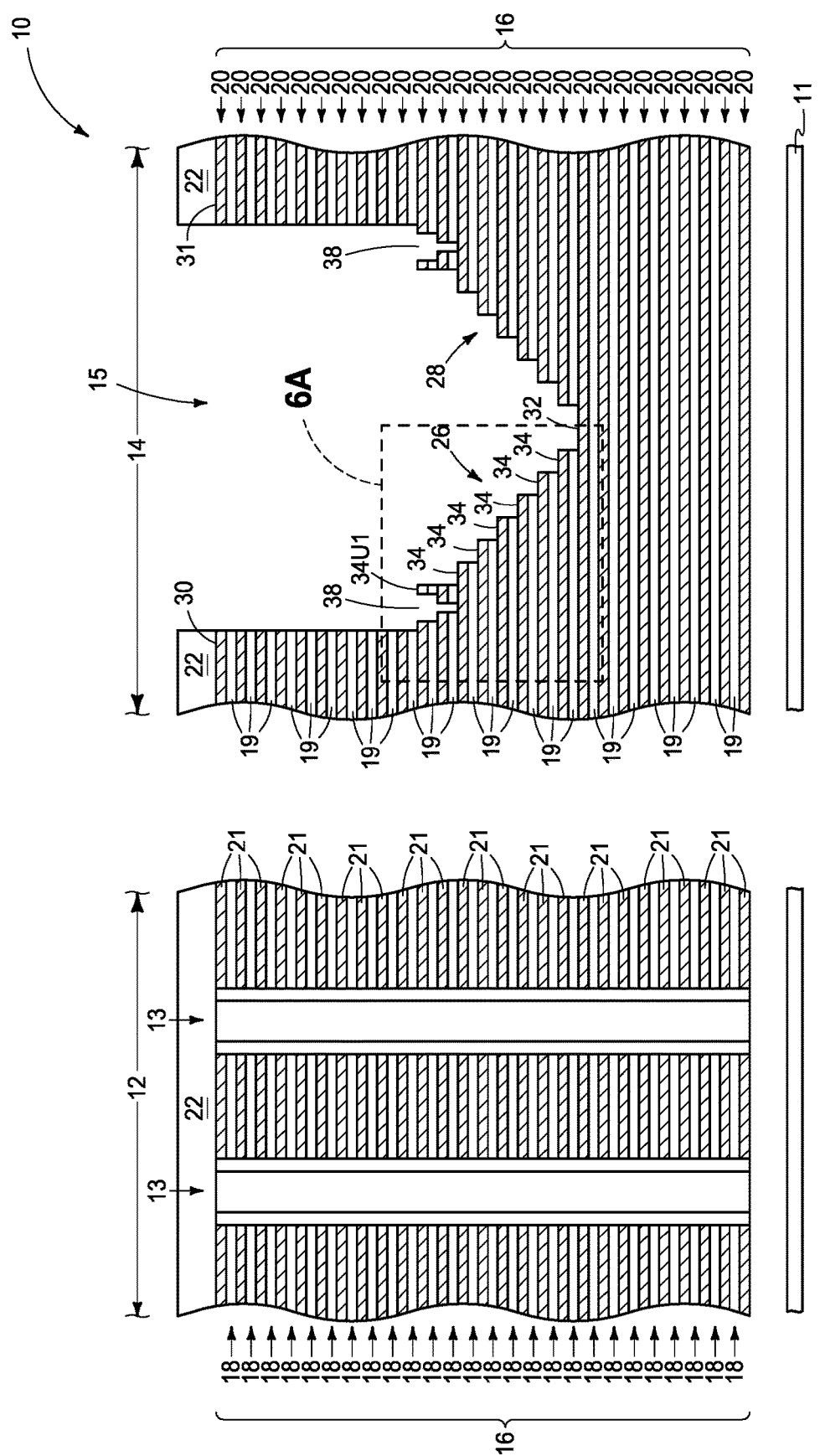
FIG. 6 is a view of the FIG. 5 construction at a processing step subsequent to that shown by FIG. 5.
Figure 6A:
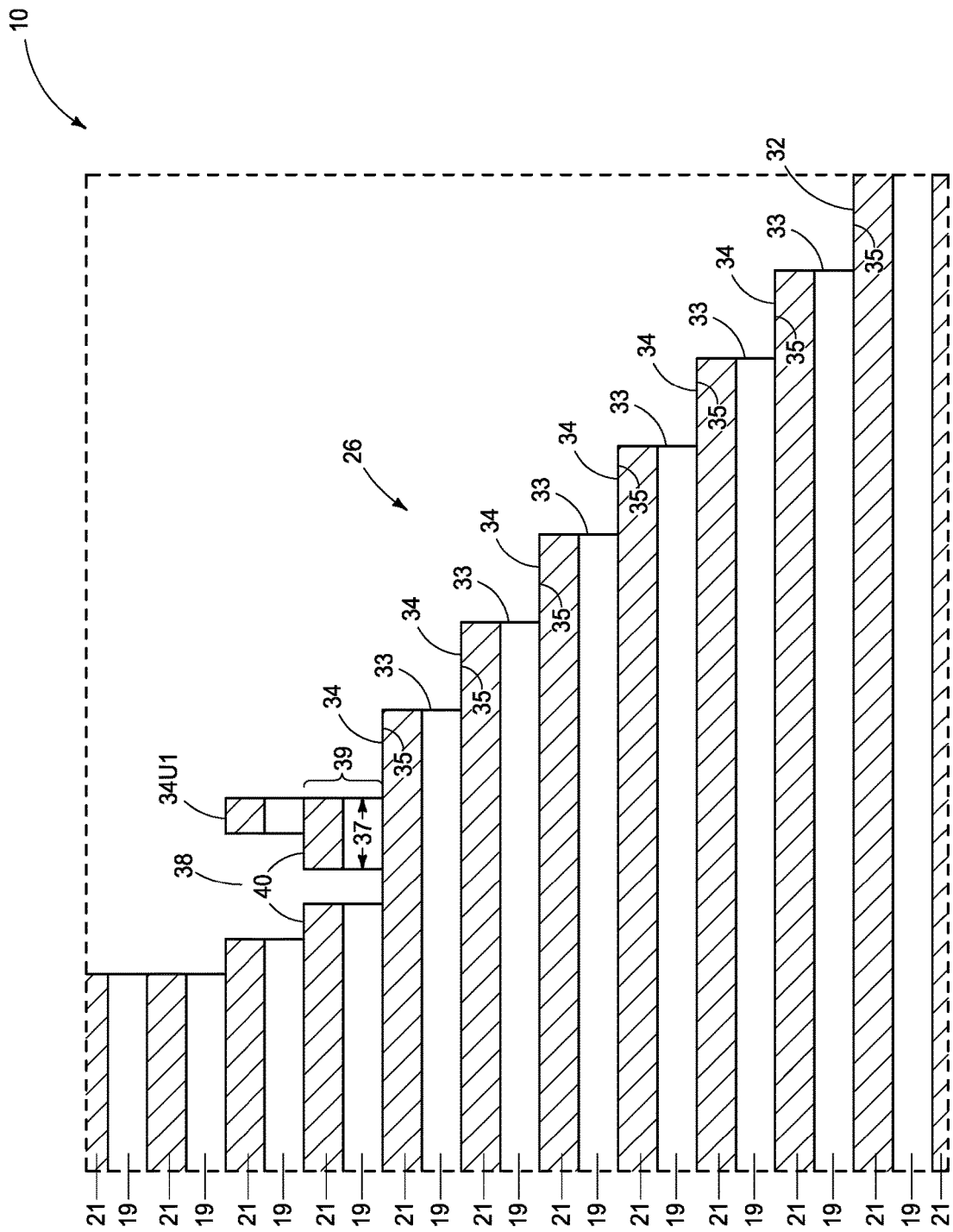
FIG. 6A is an enlarged view of a portion of FIG. 6.

Referring to FIGS. 6 and 6A, stair-step structure 26 of FIG. 5 (and correspondingly stair-step structure 28) has been translated at least partially (totally as shown) deeper into stack 16 by etching. In one embodiment, upper stair 34U1 has been used as masking material to preclude forming a gap (not shown) between the run 35 and the rise 33 of the immediately-adjacent stair 34 that is below upper stair 34U1 during such etching deeper into stack 16. In one embodiment and as shown, a gap 38 has been formed between uppermost stair 34U1 and upper landing 30. In one embodiment and as shown, gap 38 has been formed to comprise at least one stair-step 40 having a run 37 and a rise 39 that comprises two of tiers 18, 20, and in one embodiment as shown to comprise opposing and facing stair-steps individually having at least one stair-step 40. Alternately and by way of example, no stair(s) (not shown) may form in gap 38, for example with such gap having non-stepped vertical or sidewalls angled from vertical and, regardless, gap 38 need not extend completely through upper stair 34U1 (not shown). Further and by way of example only, at least one stair-step 40 may form on only one of the opposing lateral sides of gap 38 (not shown).

Figure 7:
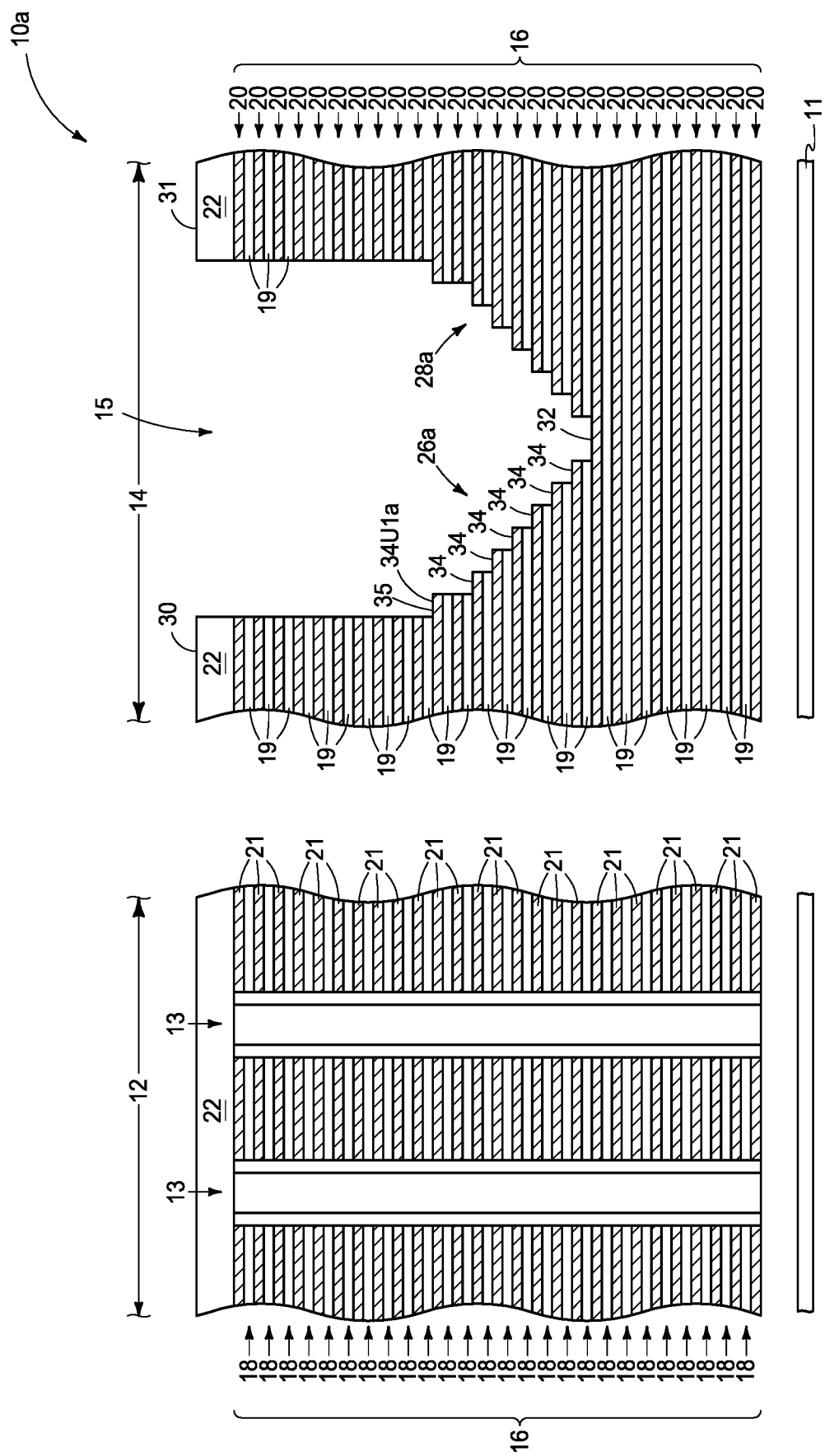
FIG. 7 is a diagrammatic cross-sectional view of a portion of a substrate construction in process in accordance with an embodiment of the invention.
Figure 8:
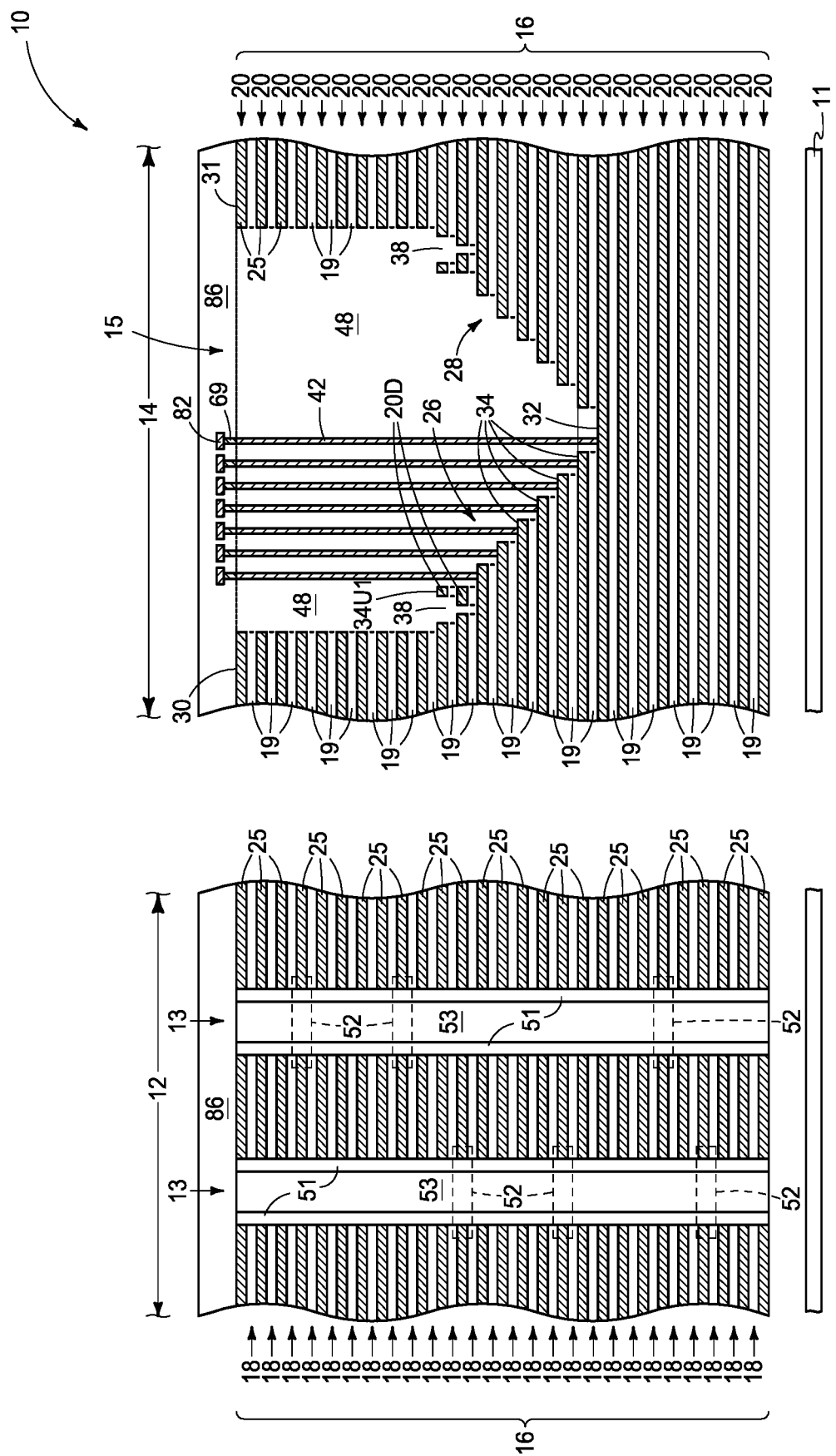
FIG. 8 is a view of the FIG. 6 construction at a processing step subsequent to that shown by FIG. 6.

FIG. 7 shows an alternate example substrate construction 10a in comparison to that shown by FIG. 6. Like numerals from the above-described embodiments have been used where appropriate, with some construction differences being indicated with the suffix "a". FIG. 7 shows an example embodiment wherein upper stair 34U1a of stair-step structure 26a (and correspondingly of stair-step structure 28a) has also been used as masking to preclude forming a gap (not shown) between the run and the rise of the immediately-adjacent stair 34 that is below upper stair 34U1a during such etching, but wherein no gap 38 (no gap 38 being shown) has been formed. Alternate example upper stair 34U1a, by way of example only, is shown as having a run 35 equal to that of the example common dimension of individual runs 35 of other stairs 34. Any other attribute(s) or aspect(s) as shown and/or described herein with respect to other embodiments may be used FIG. 8 shows example subsequent processing from that of FIG. 6 wherein sacrificial material 21 (not shown) has been replaced with conductive material 25 (e.g., conductively doped semiconductor material and/or metal material such as TiN). Such may occur by first forming slits/trenches (not shown) through stack 16 to expose lateral edges of materials 19 and 21. Then, material 21 may be isotropically etched selectively relative to insulative material 19, followed by deposition of conductive material to fill the void spaces left by removing material 21, and then followed by anisotropically etching conductive material 25 from the slits/trenches. Thereafter, insulator material 48 (e.g., doped or undoped silicon dioxide) has been formed over stair-step structures 26 and 28, and elevationally-extending operative conductive vias 42 have been formed to individually electrically couple with conductive material 25 of individual stairs 34 in stair-step structure 26. Interconnect lines 82 have been formed above stair-step structure 26 and may individually electrically couple together different conductive vias 42 through conductive extensions 69. Insulator material 86 (e.g., doped or undoped silicon dioxide) is shown surrounding interconnect lines 82 and conductive extensions 69.

Again, the above example processing was described and shown with respect to "gate-last" or "replacement-gate" processing. As an alternate example, processing could occur in accordance with "gate-first" processing wherein, for example, the FIG. 1 processing starts with conductive material 25 instead of sacrificial material 21. Further, other processing whether existing or later-developed may be used independent of when transistor gates are formed. Regardless, any other attribute(s) or aspect(s) as shown and/or described herein with respect to other embodiments may be used with respect to the above-described embodiments.

In one embodiment and as shown, array 12 is formed to comprise elevationally-extending strings 13 of memory cells 52 individually comprising a programmable charge-storage transistor 52 (a programmable charge-storage transistor may in some applications be a circuit-functioning memory cell and in other applications not). Example transistor material 51 extends elevationally through stack 16 in individual strings 13 and may be substantially be annular. Such may comprise, for example and in order of deposition, a charge-blocking region or material (e.g., silicon dioxide and/or silicon nitride), a charge-storage material (e.g., floating gate material such as doped or undoped silicon, etc. or charge-trapping material such as silicon nitride, metal dots, etc.), a charge-passage material (e.g., a bandgap-engineered structure having nitrogen-containing material such as silicon nitride laterally sandwiched between two insulating oxide layers such as silicon dioxide), and transistor channel material (e.g., suitably doped polysilicon, etc.). Radially-central portions of strings 13 may be filled with transistor material (not shown), solid insulator material 53, or be hollow (not shown). Stair-step structure 26 in circuitry region 14 adjacent array 12 is circuit-operative (e.g., it has at least some conductive stair 34 thereof that electrically couples with and between an electronic component in array 12, such as a transistor and/or memory cell, and an electronic component outside of array 12). Tiers 20 comprise wordline tiers. In one embodiment and as shown, uppermost stair 34U1 has a dummy wordline tier 20D therein, with two such dummy wordline tiers 20D being shown.

Some aspects of the invention were motivated in overcoming a problem that occurs when translating (by etching)

a stair-step structure deep into stack 16, for example as shown by FIG. 6 in comparison to FIG. 5. Such processing typically occurs by plasma etching. During such, ion bombardment particularly at the bases of the laterally-outermost vertical walls of the example stadium 15 can be sufficiently great such that a gap analogous to gap 38 forms completely through operative stair steps at the top of a stair-step structure. Heretofore, this causes a break or an "open" in those outermost stair steps, whereby the conductive material in those stair steps nowhere extend into the array and results in at least partially inoperative circuitry. Such problem may be overcome by providing an uppermost stair 34U1 whereby any gap 38 formed therein is inconsequential and accommodation is made for conductive material in those layers to be contacted and extend into array 12 from a different stair-step structure.

Stairs 34 in stair-step structure 28, in one embodiment, may be circuit-inoperative (i.e., may be "dummy", meaning no current flow there-through and which may be a circuit inoperable dead end that is not part of a current flow path of a circuit even if extending to or from an electronic component). Regardless, vertical conductive vias (not shown) that have their peripheries surrounded by insulator material (not shown) may extend through stairs 34 in stair-step structure 28, in stair-step structure 26, and/or through one or both of upper landings 30, 31 to connect with circuitry below stack 16.

Figure 9:
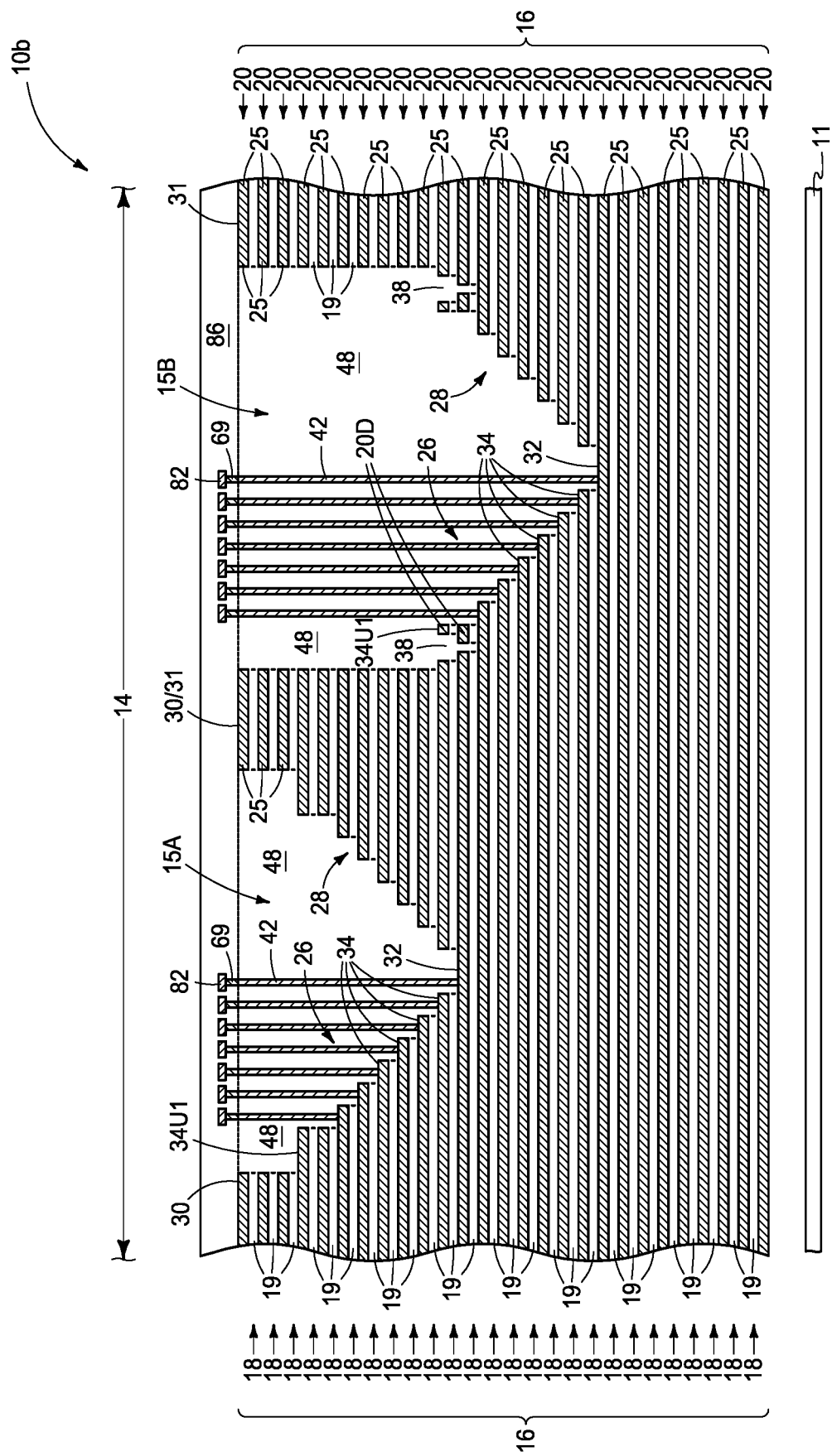
FIG. 9 is a diagrammatic cross-sectional view of a portion of a substrate construction in in accordance with an embodiment of the invention.

Embodiments of the invention comprise forming multiple stair-step structures 26 (and correspondingly, in some embodiments, multiple stair-step structures 28) whereby the above-described stair-step structure 26 is one of multiple stair-step structures 26 that are formed. Yet, when multiple stair-step structures 26 are formed, no two such stair-step structures need by of the same construction relative one another, nor is it necessary that more than one stair-step structure 26 have an upper stair that comprises at least four of tiers 18, 20 of different composition materials 19, 21. FIG. 9 shows an example substrate construction 10b wherein two stair-step structures 26 (and correspondingly, in one embodiment, two stair-step structures 28) have been formed. Like numerals from the above-described embodiments have been used where appropriate, with some construction differences being indicated with the suffix "b", "A", and "B". Array 12 is not shown in FIG. 9 due to drawing-size constraints. Adjacent of multiple stair-step structures 26 have a respective upper landing 30/31 there-between. Pairs of stair-step structures 26 and 28 individually may define a stadium 15A or 15B (e.g., a recessed portion) while landing 30/31 may individually define a crest between immediately-adjacent stadiums. In one embodiment and as shown, opposite and facing stair-step structure 28 in the left-depicted stadium 15A is between two immediately-adjacent of stair-step structures 26. All or parts of stadiums 15A and 15B may be formed at the same and/or different times relative one another.

Regardless, in one embodiment and as shown, at least one other stair-step structure 26 in addition to the one stair-step structure 26 has an upper stair (e.g., 34U1) that is below the respective landing (e.g., landing 30) and that comprises at least four of tiers 18, 20 of different composition materials 19, 21. FIG. 9 shows each of the left-depicted and right-depicted stair-step structures 26 as having such an example upper stair 34U1. The right-depicted upper stair 34U1 is shown with a gap 38 whereas the left-depicted upper stair 34U1 does not have a gap 38. Alternately by way of example, both upper stairs 34U1 may have a gap 38 (not shown) or neither upper stair 34U1 may have a gap 38 (not shown).

Any other attribute(s) or aspect(s) as shown and/or described herein with respect to other embodiments may be used.

Figure 10:
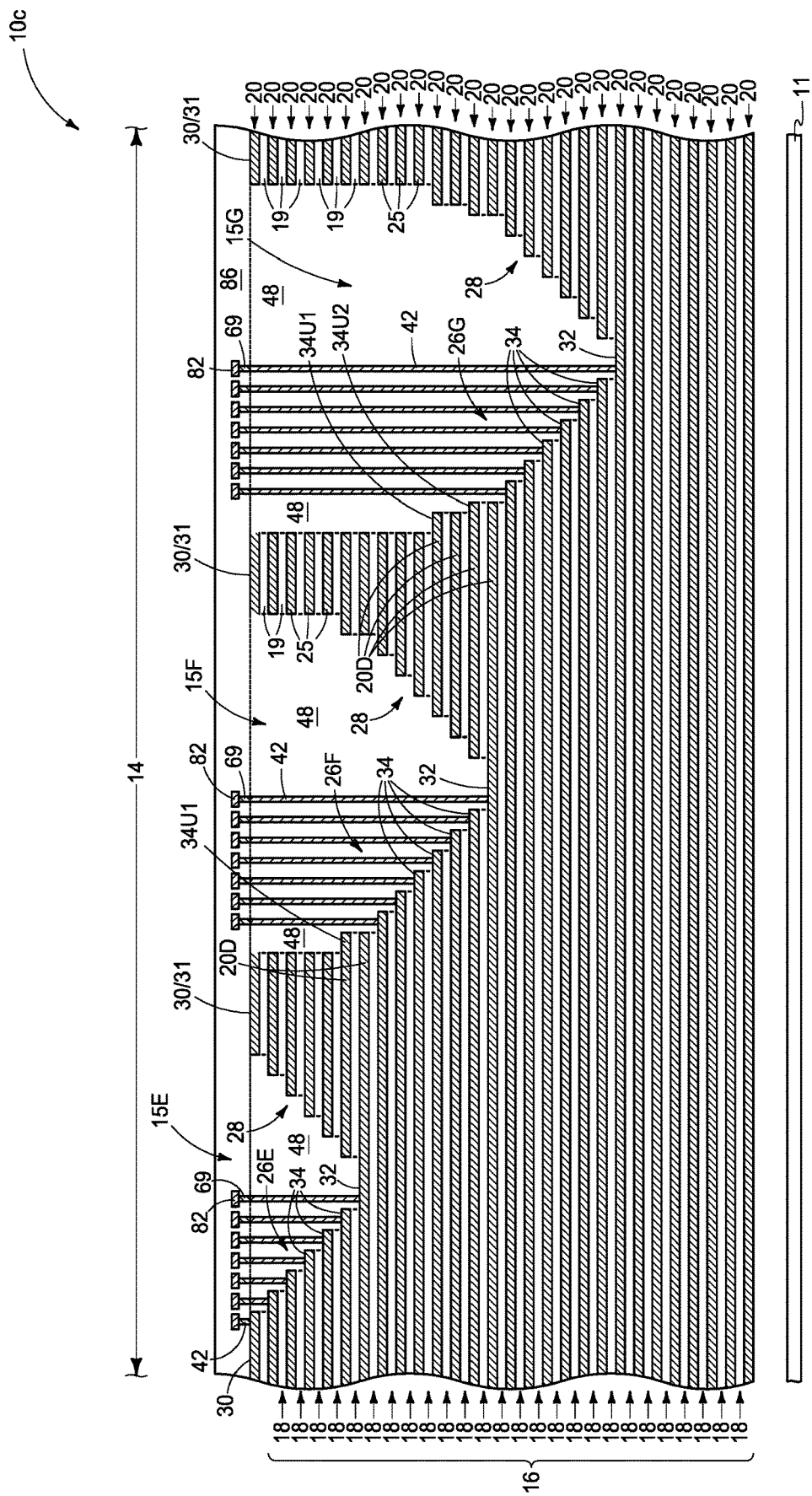
FIG. 10 is a diagrammatic cross-sectional view of a portion of a substrate construction in accordance with an embodiment of the invention.
Figure 11:
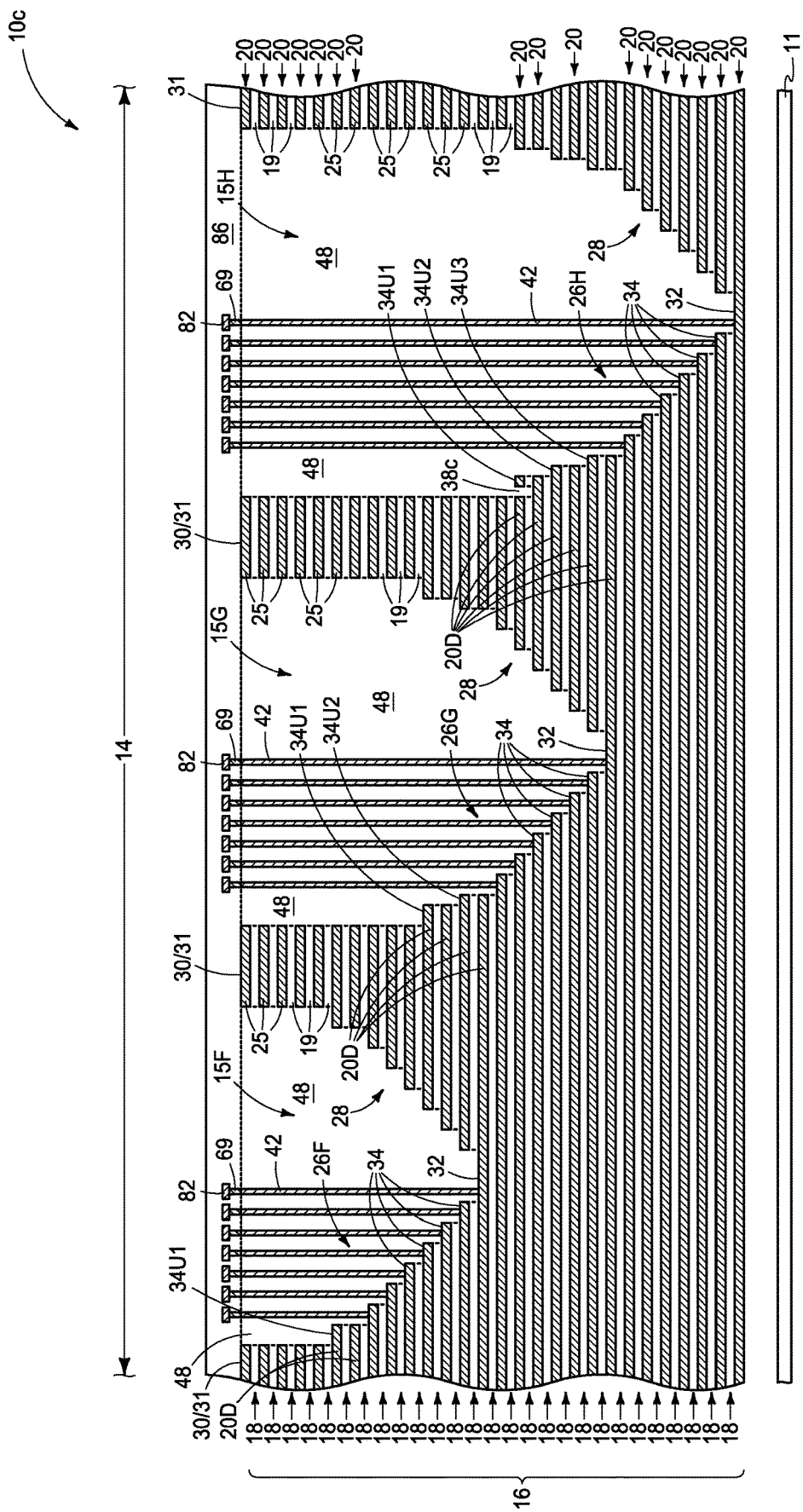
FIG. 11 is a view of a portion of the FIG. 10 substrate construction and showing another portion thereof that is not viewable in FIG. 10.

FIGS. 10 and 11 depict additional or alternate processing that may occur relative to that described above with respect to substrate constructions 10, 10a, and 10b, and with respect to a construction 10c. Like numerals from the above-described embodiments have been used where appropriate, with some construction differences being indicated with the suffix "c", "E", "F", "G", and "H", and with different numerals. Example construction 10c has four stair-step structures 26E, 26F, 26G, and 26H (generically referred to as 26*) and four stadiums 15E, 15F, 15G, and 15H. Fewer or more stairs may be in each stair-step structure 26* and no stair-step structure 26* need be of the same configuration as any other stair-step structure 26* as is shown. Array 12 (the left side of FIG. 8, and not shown in FIGS. 10 and 11 due to drawing-size constraints) comprises elevationally-extending strings 13 of memory cells 52 individually comprising a programmable charge-storage transistor 52. Circuitry region 14 is adjacent array 12 (FIG. 8) and stair-step structures 26E, 26F, 26G, and 26H are an example plurality of circuit-operative stair-step structures having an upper landing 30/31 between and above immediately-adjacent of circuit-operative stair-step structures 26E, 26F, 26G, and 26H. Four stadiums 15E, 15F, 15G, and 15H are shown, although fewer or more stadiums may be included (e.g., that are longitudinally and/or laterally spaced/arranged relative one another). Any other attribute(s) or aspect(s) as shown and/or described herein with respect to other embodiments may be used.

Stair-step structures 26F, 26G, and 26H individually have an upper stair 34U1 which in the depicted embodiment is the uppermost stair in each of stair-step structures 26F, 26G, and 26H. Stair-step structures 26G and 26H individually have an upper stair 34U2, and stair-step structures 26H has an upper stair 34U3 (upper stairs 34U1, 34U2, and 34U3 collectively or generically being referred to as 34U*). Upper stairs 34U*need not have the same run and/or rise as any other upper stair 34U and/or need not have the same number of tiers 18, and 20, for example as is shown in one embodiment. Any one or more of uppermost stairs 34U1 may have a gap therein (e.g., a gap 38c as shown in stair-step structure 26H) or none (not shown) of such uppermost stairs 34U1 may have a gap therein. The same applies to upper stairs 34U2 and 34U3 (with no gaps 38/38c being shown). Not all stair-step structures 26* need have an uppermost stair 34U1 (e.g., stair-step structure 26E not having one), and only one stair-step structure 26* (not shown) may have an uppermost stair 34U1.

Any other attribute(s) or aspect(s) as shown and/or described herein with respect to other embodiments may be used.

Any existing or later-developed alternate methods may be used to form a stair-step structure 26* having an uppermost stair, for example stair 34U1. The above method essentially shows forming such uppermost stair in conjunction with initially forming stair-step structure 26, and then translating such deeper into stack 16. Alternately and by way of example only, such uppermost stair may not be so initially formed, and the initially-formed stair-step structure then translated deep into the stack. This may be followed by a masking step that exposes one or more outer lateral edges of a desired run dimension, followed by etching into the stack to form the uppermost stair for that stair-step structure. That masking step could be dedicated solely for such purpose. Alternately and more likely, that masking step could be part of another masking/etching step in conjunction with forming or translating a different stair-step structure deeper into the stack. Regardless, all of the stair-step structures (and/or stadiums) do not need to be formed at the same time. For example, one or more stadiums could be formed at different times, or some or all only partially translated into the stack at the same time, and wherein other stadiums are masked (e.g., by a photoimageable material) during etching certain stair-step structures deeper into the stack.

Embodiments of the invention encompass integrated circuitry, for example memory integrated circuitry, independent of method of manufacture. However, any such integrated circuitry may be fabricated in accordance with methods as disclosed herein. Further, any of the structural attributes described above and elsewhere herein with respect to method embodiments may be found in structural embodiments of the invention and vice versa.

In one embodiment, memory integrated circuitry comprises an array (e.g., 12) of elevationally-extending strings (e.g., 13) of memory cells (e.g., 52) individually comprising a programmable charge-storage transistor (e.g., 52). In one such embodiment, the memory integrated circuitry comprises NAND. Regardless, the array comprises vertically-alternating insulative tiers (e.g., 18) and wordline tiers (e.g., 20). A circuitry region (e.g., 14) is adjacent the array and comprises a plurality of circuit-operative stair-step structures (e.g., 26*) having an upper landing (e.g., 30/31) between and above immediately-adjacent of the circuit-operative stair-step structures. The circuit-operative stair-step structures individually comprise some of the vertically-alternating insulative tiers and the wordline tiers and a plurality of stairs (e.g., 34, 34U*) individually comprising one of the wordline tiers and one of the insulative tiers. At least some of the stairs (e.g., 34) individually have only one of the wordline tiers and only one of the insulative tiers. The only one wordline tier of individual of the at least some stairs extends into the array and is directly electrically coupled to at least one of the programmable charge-storage transistors in that one wordline tier. At least one of the circuit-operative stair-step structures has an uppermost stair (e.g., 34U1) therein (three stair-step structures 26F, 26G, and 26H as shown in FIGS. 10 and 11) that is below the upper landing (e.g., 30/31) that is between the one circuit-operative stair-step structure and the circuit-operative stair-step structure that is immediately-adjacent the one circuit-operative stair-step structure towards the array. Reference to "immediately-adjacent" with respect circuit-operative stair-step structures means two circuit-operative stair-step structures having no other circuit-operative stair-step structure there-between, although one or more circuit-inoperative stair-step structure(s) may be between two immediately-adjacent circuit-operative stair-step structures (e.g., a circuit-inoperative stair-step structure 28 that is opposite and facing respective circuit-operative stair-step structures 26, 26*). That uppermost stair has a dummy wordline tier (e.g., 20D) therein.

In some embodiments and as shown, the uppermost stair comprises at least two dummy wordline tiers and at least two of insulative tiers therein. In one embodiment and as shown, wordline tier 20 that is a dummy wordline tier 20D in the one circuit-operative stair-step structure 26* is an active wordline tier in the immediately-adjacent circuit-operative stair-step structure 26*, extends into array 12 therefrom, and stair 34 of that active wordline tier in the immediately-adjacent circuit-operative stair-step structure is contacted by an elevationally-extending conductive via 42.

In one embodiment, a gap (e.g., gap 38c in FIG. 11) is between uppermost stair 34U1 and upper landing 30/31 in the circuit-operative stair-step structure (e.g., circuit-operative stair-step structure 26H). Alternately, no gap may between the uppermost stair and the upper landing (e.g., as in circuit-operative stair-step structures 26G, and 26F).

Any other attribute(s) or aspect(s) as shown and/or described herein with respect to other embodiments may be used.

An embodiment of the invention encompasses integrated circuitry comprising a 3D array (e.g., 12) comprising tiers (e.g., 20) of electronic components (e.g., transistors 52). The integrated circuitry comprises a circuit-operative stair-step structure (e.g., 26, 26*). An upper landing (e.g., 30/31) is adjacent and above the circuit-operative stair-step structure. The circuit-operative stair-step structure comprises vertically-alternating insulative tiers (e.g., 18) and conductive tiers (e.g., 20) (regardless of whether such are wordline tiers of memory integrated circuitry). A plurality of stairs (e.g., 34, 34U*) individually comprise one of the conductive tiers and one of the insulative tiers. At least some of the stairs (e.g., 34) individually have only one of the conductive tiers and only one of the insulative tiers. The only one conductive tier of such at least some of the stairs extends into one of the tiers of the 3D array and is electrically coupled, in one embodiment directly electrically coupled, to at least one of the electronic components in that one tier. An uppermost of the stairs (e.g., 34U1) that is below the upper landing has a dummy conductive tier therein (e.g., 20D), and regardless of whether extending into the 3D array from the circuit-operative stair-step structure and regardless of whether comprising at least two of the conductive tiers and at least two of the insulative tiers). In one embodiment, the uppermost stair comprises multiple dummy conductive tiers therein.

In one embodiment, the integrated circuitry comprises another stair-step structure adjacent and below the upper landing. In such embodiment, the dummy conductive tier in the uppermost stair of the circuit-operative stair-step structure is a circuit-active tier in the another stair-step structure. The another stair-step structure comprises a stair comprising the circuit-active tier, and the circuit-active tier extends into the 3D array from the another stair-step structure. The stair in the another stair-step structure is contacted by an elevationally-extending conductive via.

In one embodiment, the stair (e.g., 34U2) that is immediately-under the uppermost stair (e.g., 34U1) has a dummy conductive tier therein (e.g., 20D in 34U2 in either of stair-step structures 15G or 15H). In one embodiment, multiple of the stairs (e.g., 34U2 and 34U3 in stair-step structure 15H) that are successively immediately-under the uppermost stair individually have a dummy conductive tier therein.

Any other attribute(s) or aspect(s) as shown and/or described herein with respect to other embodiments may be used.

In some embodiments, integrated circuitry in accordance with the invention comprises a 3D array (e.g., 12) comprising tiers (e.g., 20) of electronic components (e.g., transistors 52) and a circuit-operative stair-step structure (e.g., 26, 26*). An upper landing (e.g., 30, 30/31) is adjacent and above the circuit-operative stair-step structure. The circuit-operative stair-step structure comprises vertically-alternating insulative tiers (e.g., 18) and conductive tiers (e.g., 20). The circuit-operative stair-step structure comprises a plurality of stairs (e.g., 34, 34U*) individually comprising one of the conductive tiers and one of the insulative tiers. At least some of the stairs (e.g., 34) individually have only one of the conductive tiers and only one of the insulative tiers. The only one conductive tier of individual of the stairs extends into one of the tiers of the 3D array and is electrically coupled to at least one of the electronic components in that one tier. An uppermost of the stairs (e.g., 34U*) is below the upper landing and has at least one conductive tier therein that does not extend into the 3D array of the electronic components from the circuit-operative stair-step structure (regardless of whether the uppermost stair has a dummy conductive tier therein and regardless of whether the uppermost stair has at least two conductive tiers and at least two insulative tiers therein).

In one embodiment, the uppermost stair has at least two conductive tiers therein that do not extend into the 3D array, and in one such embodiment has at least three conductive tiers therein (not shown) that do not extend into the 3D array, from that uppermost stair. In one embodiment, all of the stairs individually comprise one of the conductive tiers atop and contacting an underlying one of the insulative tiers. In one embodiment, the stair that is immediately-under the uppermost stair has at least one conductive tier therein that does not extend into the 3D array from the circuit-operative stair-step structure. In one embodiment, multiple of the stairs that are successively immediately-under the uppermost stair individually have at least one conductive tier therein that does not extend into the 3D array of the electronic components from the circuit-operative stair-step structure.

Any other attribute(s) or aspect(s) as shown and/or described herein with respect to other embodiments may be used.

In some embodiments, integrated circuitry comprises a 3D array (e.g., 12) of electronic components (e.g., 52). A circuit-operative stair-step structure (e.g., 26, 26*) is electrically coupled to the electronic components of the 3D array. An upper landing (e.g., 30, 30/31) is adjacent and above the circuit-operative stair-step structure. The circuit-operative stair-step structure comprises vertically-alternating insulative tiers (e.g., 18) and conductive tiers (e.g., 20). The circuit-operative stair-step structure comprises a plurality of stairs (e.g., 34, 34U*) individually comprising one of the conductive tiers and one of the insulative tiers. At least some of the stairs (e.g., 34) individually have only one of the conductive tiers and only one of the insulative tiers. An uppermost of the stairs (e.g., 34U*) that is below the upper landing comprises at least two of the conductive tiers and at least two of the insulative tiers (regardless of whether having at least one conductive tier therein that does not extend into the 3D array from the circuit-operative stair-step structure, and regardless of whether the uppermost stair has a dummy conductive tier therein). In one embodiment, the uppermost stair comprises at least three of the conductive tiers (not shown).

Any other attribute(s) or aspect(s) as shown and/or described herein with respect to other embodiments may be used.

In some embodiments, integrated circuitry comprises a 3D array (e.g., 12) of electronic components (e.g., 52). A circuit-operative stair-step structure (e.g., 26, 26*) is electrically coupled to the electronic components of the 3D array. An upper landing (e.g., 30, 30/31) is adjacent and above the circuit-operative stair-step structure. The circuit-operative stair-step structure comprises vertically-alternating insulative tiers (e.g., 18) and conductive tiers (e.g., 20). The circuit-operative stair-step structure comprises a plurality of stairs (e.g., 34, 34U*) individually comprising one of the conductive tiers and one of the insulative tiers. At least some of the stairs individually have only one of the conductive tiers and only one of the insulative tiers. The respective only ones of the conductive tiers extend into the array and directly electrically couple with ones of the electronic components. An uppermost of the stairs (e.g., 34U1) that is below the upper landing comprises at least two of the conductive tiers and at least two of the insulative tiers. A gap (e.g., 38, 38*c*) is between the uppermost stair and the upper landing. In some such embodiments, the gap comprises at least one circuit-inoperative stair-step individually comprising one of the conductive tiers. In one embodiment, the gap comprises opposing and facing stair-steps individually having at least one circuit-inoperative stair-step comprising one of the conductive tiers.

Any other attribute(s) or aspect(s) as shown and/or described herein with respect to other embodiments may be used.

In the inventions disclosed above, other processing and/or structure may be used as is disclosed in any of U.S. Patent Application Publication No. 2015/0001613; U.S. Pat. No. 9,589,978; U.S. Patent Application Publication No. 2017/0263556; U.S. Patent Application Publication No. 2017/0287833, and U.S. Patent Application Publication No. 2018/0082940. U.S. Patent Application Publication No. 2015/0001613; U.S. Pat. No. 9,589,978; U.S. Patent Application Publication No. 2017/0287833, and U.S. Patent Application Publication No. 2018/0082940 are herein and hereby incorporated by reference.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", extend(ing) horizontally, and horizontally-extending with respect to a field effect transistor are with reference to orientation of the transistor's channel length along which current flows in operation between the source/drain regions. For bipolar junction transistors, "extend(ing) elevationally" "elevationally-extending", extend(ing) horizontally, and horizontally-extending, are with reference to orientation of the base length along which current flows in operation between the emitter and collector.

Further, "directly above" and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "under" not preceded by "directly" only requires that some portion of the stated region/material/component that is under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable or later-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other, and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Additionally, "metal material" is any one or combination of an elemental metal, a mixture or an alloy of two or more elemental metals, and any conductive metal compound.

Further, a "dummy conductive tier" and a "dummy wordline tier" is a conductive tier or wordline tier that has no electrical function. (i.e., no current flow there-through and which may be a circuit inoperable dead end that is not part of a current flow path of a circuit even if extending to for from an electronic component).

CONCLUSION

In some embodiments, integrated circuitry comprises a 3D array comprising tiers of electronic components and a circuit-operative stair-step structure. An upper landing is adjacent and above the circuit-operative stair-step structure. The circuit-operative stair-step structure comprises vertically-alternating insulative tiers and conductive tiers. A plurality of stairs individually comprise one of the conductive tiers and one of the insulative tiers. At least some of the stairs individually have only one of the conductive tiers and only one of the insulative tiers. The only one conductive tier extends into one of the tiers of the 3D array of the electronic components and is electrically coupled to at least one of the electronic components in that one tier. An uppermost of the stairs that is below the upper landing has at least one conductive tier therein that does not extend into the 3D array of the electronic components from the circuit-operative stair-step structure.

In some embodiments, integrated circuitry comprises a 3D array comprising tiers of electronic components and a circuit-operative stair-step structure. An upper landing is adjacent and above the circuit-operative stair-step structure. The circuit-operative stair-step structure comprises vertically-alternating insulative tiers and conductive tiers. A plurality of stairs individually comprises one of the conductive tiers and one of the insulative tiers. At least some of the stairs individually have only one of the conductive tiers and only one of the insulative tiers. The only one conductive tier extends into one of the tiers of the 3D array of the electronic components and is electrically coupled to at least one of the electronic components in that one tier. An uppermost of the stairs that is below the upper landing has a dummy conductive tier therein.

In some embodiments, integrated circuitry comprises a 3D array of electronic components and a circuit-operative stair-step structure electrically coupled to the electronic components of the 3D array. An upper landing is adjacent and above the circuit-operative stair-step structure. The circuit-operative stair-step structure comprises vertically-alternating insulative tiers and conductive tiers. A plurality of stairs individually comprise one of the conductive tiers and one of the insulative tiers. At least some of the stairs individually have only one of the conductive tiers and only one of the insulative tiers. An uppermost of the stairs that is below the upper landing comprises at least two of the conductive tiers and at least two of the insulative tiers.

In some embodiments, integrated circuitry comprises a 3D array of electronic components and a circuit-operative stair-step structure electrically coupled to the electronic components of the 3D array. An upper landing is adjacent and above the circuit-operative stair-step structure. The circuit-operative stair-step structure comprises vertically-alternating insulative tiers and conductive tiers. A plurality of stairs individually comprise one of the conductive tiers and one of the insulative tiers. At least some of the stairs individually having only one of the conductive tiers and only one of the insulative tiers. The respective only ones of the conductive tiers extend into the array and directly electrically couple with ones of the electronic components. An uppermost of the stairs that is below the upper landing comprises at least two of the conductive tiers and at least two of the insulative tiers. A gap is between the uppermost stair and the upper landing.

In some embodiments, memory integrated circuitry comprises an array of elevationally-extending strings of memory cells individually comprising a programmable charge-storage transistor. The array comprises vertically-alternating insulative tiers and wordline tiers. A circuitry region is adjacent the array and comprises a plurality of circuit-operative stair-step structures having an upper landing between and above immediately-adjacent of the circuit-operative stair-step structures. The circuit-operative stair-step structures individually comprise some of the vertically-alternating insulative tiers and the wordline tiers. A plurality of stairs individually comprise one of the wordline tiers and one of the insulative tiers. At least some of the stairs individually have only one of the wordline tiers and only one of the insulative tiers. The only one wordline tier of individual of the at least some stairs extend into the array and are directly electrically coupled to at least one of the programmable charge-storage transistors in that one wordline tier. At least one of the circuit-operative stair-step structures has an uppermost of the stairs therein that is below the upper landing that is between the one circuit-operative stair-step structure and the circuit-operative stair-step structure that is immediately-adjacent the one circuit-operative stair-step structure towards the array. That uppermost stair has a dummy wordline tier therein.

In some embodiments, a method used in forming integrated circuitry comprises forming a stack of vertically-alternating tiers of different composition materials. A stair-step structure is formed into the stack and an upper landing is formed adjacent and above the stair-step structure. The stair-step structure is formed to comprise vertically-alternating tiers of the different composition materials. A plurality of stairs individually comprise two of the tiers of different composition materials. At least some of the stairs individually have only two tiers that are each only of a different one of the different composition materials. An upper of the stairs that is below the upper landing comprises at least four of the tiers of different composition materials.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. Integrated circuitry comprising:
   a three-dimensional (3D) array comprising tiers of electronic components;
   a circuit-operative stair-step structure;
   an upper conductive landing adjacent and above the circuit-operative stair-step structure; and
   the circuit-operative stair-step structure comprising a circuit-operative stair flight, the stair flight comprising:
      vertically alternating insulative tiers and conductive tiers;
      a plurality of stairs individually comprising one of the conductive tiers and one of the insulative tiers, at least some of the stairs of the plurality of stairs individually having only one of the conductive tiers and only one of the insulative tiers, the only one conductive tier extending into one of the tiers of the 3D array of the electronic components and being electrically coupled to at least one of the electronic components in that one tier; and
      an uppermost of the plurality of stairs that is below the upper conductive landing having at least one conductive tier therein that does not extend into the 3D array of the electronic components from the circuit-operative stair-step structure.

2. The integrated circuitry of claim 1 comprising a circuit-inoperative stair-step structure opposite and facing the circuit-operative stair flight.

3. The integrated circuitry of claim 1 wherein the circuit-operative stair-step structure is one circuit-operative stair-step structure, the integrated circuitry comprising:
   another circuit-operative stair-step structure adjacent and below the upper conductive landing; and wherein:
      the one conductive tier that does not extend into the 3D array from the one circuit-operative stair-step structure does extend into the 3D array from the another circuit-operative stair-step structure;
      the another circuit-operative stair-step structure comprising a stair comprising the one conductive tier that does extend into the 3D array from the another circuit-operative stair-step structure; and
      the stair in the another circuit-operative stair-step structure being contacted by an elevationally-extending conductive via.

4. The integrated circuitry of claim 3 comprising a circuit-inoperative stair-step structure opposite and facing the another circuit-operative stair-step structure and which is between the another circuit-operative stair-step structure and the one circuit-operative stair-step structure.

5. The integrated circuitry of claim 1 wherein the electronic components comprise transistors.

6. The integrated circuitry of claim 1 wherein the electronic components comprise memory cells.

7. The integrated circuitry of claim 1 wherein the uppermost stair has at least two conductive tiers therein that do not extend into the 3D array.

8. The integrated circuitry of claim 7 wherein the uppermost stair has at least three conductive tiers therein that do not extend into the 3D array.

9. The integrated circuitry of claim 1 comprising a gap between the uppermost stair and the upper conductive landing.

10. The integrated circuitry of claim 1 wherein all of the stairs of the plurality of stairs individually comprise one of the conductive tiers atop and contacting an underlying one of the insulative tiers.

11. Integrated circuitry comprising:
   a three-dimensional (3D) array comprising tiers of electronic components;
   a circuit-operative stair-step structure;
   an upper landing adjacent and above the circuit-operative stair-step structure;
   the circuit-operative stair-step structure comprising:
      vertically alternating insulative tiers and conductive tiers;
      a plurality of stairs individually comprising one of the conductive tiers and one of the insulative tiers, at least some of the stairs of the plurality of stairs individually having only one of the conductive tiers and only one of the insulative tiers, the only one conductive tier extending into one of the tiers of the 3D array of the electronic components and being electrically coupled to at least one of the electronic components in that one tier;
   an uppermost of the plurality of stairs that is below the upper landing having at least one conductive tier therein that does not extend into the 3D array of the electronic components from the circuit-operative stair-step structure; and wherein a stair that is immediately under the uppermost stair has at least one conductive tier therein that does not extend into the 3D array of the electronic components from the circuit-operative stair-step structure.

12. Integrated circuitry comprising:
a three-dimensional (3D) array comprising tiers of electronic components;
a circuit-operative stair-step structure;
an upper landing adjacent and above the circuit-operative stair-step structure;
the circuit-operative stair-step structure comprising:
vertically alternating insulative tiers and conductive tiers;
a plurality of stairs individually comprising one of the conductive tiers and one of the insulative tiers, at least some of the stairs of the plurality of stairs individually having only one of the conductive tiers and only one of the insulative tiers, the only one conductive tier extending into one of the tiers of the 3D array of the electronic components and being electrically coupled to at least one of the electronic components in that one tier;
an uppermost of the plurality of stairs that is below the upper landing having at least one conductive tier therein that does not extend into the 3D array of the electronic components from the circuit-operative stair-step structure; and
wherein multiple of the stairs of the plurality of stairs that are successively immediately under the uppermost stair individually have at least one conductive tier therein that does not extend into the 3D array of the electronic components from the circuit-operative stair-step structure.

13. Integrated circuitry comprising:
a three-dimensional (3D) array comprising tiers of electronic components;
a circuit-operative stair-step structure;
an upper landing adjacent and above the circuit-operative stair-step structure; and
the circuit-operative stair-step structure comprising:
vertically alternating insulative tiers and conductive tiers;
a plurality of stairs individually comprising one of the conductive tiers and one of the insulative tiers, at least some of the stairs of the plurality of stairs individually having only one of the conductive tiers and only one of the insulative tiers, the only one conductive tier extending into one of the tiers of the 3D array of the electronic components and being electrically coupled to at least one of the electronic components in that one tier;
an uppermost of the plurality of stairs that is below the upper landing having a dummy conductive tier therein; and
wherein a stair that is immediately under the uppermost stair has a dummy conductive tier therein.

14. Integrated circuitry comprising:
a three-dimensional (3D) array comprising tiers of electronic components;
a circuit-operative stair-step structure;
an upper landing adjacent and above the circuit-operative stair-step structure; and
the circuit-operative stair-step structure comprising:
vertically alternating insulative tiers and conductive tiers;
a plurality of stairs individually comprising one of the conductive tiers and one of the insulative tiers, at least some of the stairs of the plurality of stairs individually having only one of the conductive tiers and only one of the insulative tiers, the only one conductive tier extending into one of the tiers of the 3D array of the electronic components and being electrically coupled to at least one of the electronic components in that one tier;
an uppermost of the plurality of stairs that is below the upper landing having a dummy conductive tier therein; and
wherein multiple of the stairs of the plurality of stairs that are successively immediately under the uppermost stair individually have a dummy conductive tier therein.

15. Memory integrated circuitry comprising:
an array of elevationally-extending strings of memory cells individually comprising a programmable charge-storage transistor, the array comprising vertically alternating insulative tiers and wordline tiers;
a circuitry region adjacent the array and comprising a plurality of circuit-operative stair-step structures having an upper conductive landing between and above immediately adjacent of the circuit-operative stair-step structures of the plurality of circuit-operative stair-step structures, the circuit-operative stair-step structures individually comprising:
some of the vertically alternating insulative tiers and the wordline tiers;
a plurality of stairs individually comprising one of the wordline tiers and one of the insulative tiers, at least some of the stairs of the plurality of stairs individually having only one of the wordline tiers and only one of the insulative tiers, the only one wordline tier of individual of the at least some of the stairs of the plurality of stairs extending into the array and being directly electrically coupled to at least one of the programmable charge-storage transistors in that one wordline tier; and
at least one of the circuit-operative stair-step structures of the plurality of circuit-operative stair-step structures having an uppermost of the plurality of stairs therein that is below the upper conductive landing that is between the at least one circuit-operative stair-step structure and the circuit-operative stair-step structure of the plurality of circuit-operative stair-step structures that is immediately adjacent the at least one circuit-operative stair-step structure towards the array, said uppermost stair having a dummy wordline tier therein.

16. The memory integrated circuitry of claim 15 wherein said uppermost stair comprises at least two dummy wordline tiers and at least two of the insulative tiers therein.

17. The memory integrated circuitry of claim 15 wherein the wordline tier that is the dummy wordline tier in the one circuit-operative stair-step structure is an active wordline tier in said immediately adjacent circuit-operative stair-step structure of the plurality of circuit-operative stair-step structures and a stair of the active wordline tier in said immediately adjacent circuit-operative stair-step structure being contacted by an elevationally-extending conductive via, the active wordline tier in said immediately adjacent circuit-operative stair-step structure extending into the array of elevationally-extending strings of memory cells from said immediately adjacent circuit-operative stair-step structure.

18. The memory integrated circuitry of claim 15 comprising NAND architecture.

19. Integrated circuitry comprising:
a three-dimensional (3D) array of electronic components;
a circuit-operative stair-step structure electrically coupled to the electronic components of the 3D array;
an upper landing adjacent and above the circuit-operative stair-step structure;
the circuit-operative stair-step structure comprising:
vertically alternating insulative tiers and conductive tiers;
a plurality of stairs individually comprising one of the conductive tiers and one of the insulative tiers, at least some of the stairs of the plurality of stairs individually having only one of the conductive tiers and only one of the insulative tiers, the respective only ones of the conductive tiers extending into the array and directly electrically coupling with ones of the electronic components; and
an uppermost of the plurality of stairs that is below the upper landing comprising at least two of the conductive tiers and at least two of the insulative tiers;
a gap between the uppermost stair and the upper landing, the gap extending through another one of the conductive tiers that is not one of said respective only ones of the conductive tiers extending into the array; and
wherein the gap comprises at least one circuit-inoperative stair-step comprising said another one conductive tier of the conductive tiers that is not one of said respective only ones of the conductive tiers extending into the array.

20. A method used in forming integrated circuitry, comprising:
forming a stack of vertically alternating tiers of different composition materials;
forming a stair-step structure into the stack and forming an upper landing adjacent and above the stair-step structure, the stair-step structure being formed to comprise:
vertically alternating tiers of the different composition materials;
a plurality of stairs individually comprising two of the tiers of different composition materials, at least some of the stairs of the plurality of stairs individually having only two tiers that are each only of a different one of the different composition materials; and
an upper of the stairs of the plurality of stairs that is below the upper landing comprising at least four of the tiers of different composition materials;
wherein the stairs of the plurality of stairs individually comprise a rise and a run, and
further comprising:
at least partially translating the stair-step structure deeper into the stack by etching deeper into the stack; and
using the upper stair as masking material to preclude forming a gap between the run and the rise of an immediately adjacent of the stairs of the plurality of stairs that is below the upper stair during said etching.

21. The method of claim 20 wherein the upper stair is the uppermost stair of the stair-step structure.

22. The method of claim 21 comprising forming a gap between the uppermost stair and the upper landing.

23. The method of claim 22 comprising forming the gap to comprise at least one stair-step comprising two of the tiers of different composition materials.

24. The method of claim 22 comprising forming the gap to comprise opposing and facing stair-steps individually having at least one stair-step comprising two of the tiers of different composition materials.

25. Integrated circuitry comprising:
a three-dimensional (3D) array comprising tiers of electronic components;
a circuit-operative stair-step structure comprising a stadium comprising laterally-opposing stair flights in a vertical cross-section, one of the laterally-opposing stair flights being a circuit-operative stair flight inside the stadium, another of the laterally-opposing stair flights being a circuit-inoperative stair flight inside the stadium, laterally-opposing sides of the stadium comprising vertically alternating insulative tiers and conductive tiers;
each of the circuit-operative stair flight inside the stadium and the circuit-inoperative stair flight inside the stadium comprising a plurality of stairs individually comprising one of the conductive tiers and one of the insulative tiers;
at least some of the stairs of the plurality of stairs in the circuit-operative stair flight inside the stadium individually having only one of the conductive tiers and only one of the insulative tiers, the only one conductive tier extending into one of the tiers of the 3D array of the electronic components and being electrically coupled to at least one of the electronic components in that one tier;
an upper landing adjacent and above the circuit-operative stair flight, the upper landing comprising another one of the conductive tiers or another one of the insulative tiers and that is an uppermost tier of one of the laterally-opposing sides of the stadium; and
an uppermost of the plurality of stairs in the circuit-operative stair flight that is below the upper landing and that is inside the stadium having at least one conductive tier therein that does not extend into the 3D array of the electronic components from the circuit-operative stair-step structure.

26. The integrated circuitry of claim 25 wherein the another one is another one of the conductive tiers.

27. The integrated circuitry of claim 25 comprising multiple of said stadiums in said vertical cross-section.

28. The integrated circuitry of claim 27 wherein said multiple stadiums in said vertical cross-section individually have one of said upper landings that is coplanar with all said upper landings in the vertical cross-section.

29. The integrated circuitry of claim 28 wherein all said upper landings have their respective another one being another one of the conductive tiers.

30. The integrated circuitry of claim 25 comprising insulator material directly above the upper landing.

31. The integrated circuitry of claim 30 wherein the insulator material comprising silicon dioxide directly above the upper landing.

32. The integrated circuitry of claim 30 wherein the insulator material is directly against the upper landing.

33. The integrated circuitry of claim 25 comprising multiple of the insulative tiers and multiple of the conductive tiers above and between said uppermost of the plurality of stairs in the circuit-operative stair flight and said upper landing.

34. The integrated circuitry of claim 25 comprising memory circuitry, tiers of electronic components comprising an array of elevationally-extending strings of memory cells individually comprising a programmable charge-storage transistor, the conductive tiers comprising wordline tiers.

35. The integrated circuitry of claim 34 comprising multiple of said stadiums in said vertical cross-section.

36. The integrated circuitry of claim 35 wherein said multiple stadiums in said vertical cross-section individually have one of said upper landings that is coplanar with all said upper landings in the vertical cross-section.

37. The integrated circuitry of claim 34 comprising insulator material directly above the upper landing.

38. The integrated circuitry of claim 37 wherein the insulator material comprising silicon dioxide directly above the upper landing.

39. The integrated circuitry of claim 37 wherein the insulator material is directly against the upper landing.

40. The integrated circuitry of claim 34 comprising multiple of the insulative tiers and multiple of the conductive tiers above and between said uppermost of the plurality of stairs in the circuit-operative stair flight and said upper landing.

* * * * *